United States Patent
Imai

(10) Patent No.: US 7,557,743 B2
(45) Date of Patent: Jul. 7, 2009

(54) D/A CONVERTER

(75) Inventor: Shigeo Imai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/951,837

(22) Filed: Dec. 6, 2007

(65) Prior Publication Data
US 2008/0136694 A1 Jun. 12, 2008

(30) Foreign Application Priority Data
Dec. 8, 2006 (JP) .............................. 2006-331767

(51) Int. Cl.
*H03M 1/66* (2006.01)
(52) U.S. Cl. ...................... 341/144; 341/117; 341/118; 341/119; 341/120
(58) Field of Classification Search ......... 341/117–120, 341/144
See application file for complete search history.

(56) References Cited

U.S. PATENT DOCUMENTS 3,842,412 A * 10/1974 Spofford, Jr. ............... 341/119
5,955,980 A * 9/1999 Hanna ........................ 341/120
6,509,854 B1 * 1/2003 Morita et al. ............... 341/144
2006/0114138 A1 * 6/2006 Eloranta ..................... 341/144

FOREIGN PATENT DOCUMENTS

JP 2004-080238 3/2004

OTHER PUBLICATIONS

Cong et al, A 1.5-V 14-Bit 100-MS/s Self-Calibrated DAC, Dec. 2003, IEEE JSSS, vol. 38, No. 12.

* cited by examiner

*Primary Examiner*—Jean B Jeanglaude
(74) *Attorney, Agent, or Firm*—Turocy & Watson, LLP

(57) ABSTRACT

A D/A converter has a reference comparison current generator configured to generate a reference comparison current, a first reference current generator configured to generate a first reference current capable of correcting a current level, a first D/A converting part capable of outputting a first full-scale current having a predetermined proportional relationship with the first reference current and capable of generating a first D/A converting voltage in accordance with first input digital data, and a current comparator configured to generate a difference current between the first full-scale current and the reference comparison current to determine a magnitude of the difference current. The first reference current generator corrects the first reference current based on a result determined by the current comparator.

18 Claims, 7 Drawing Sheets

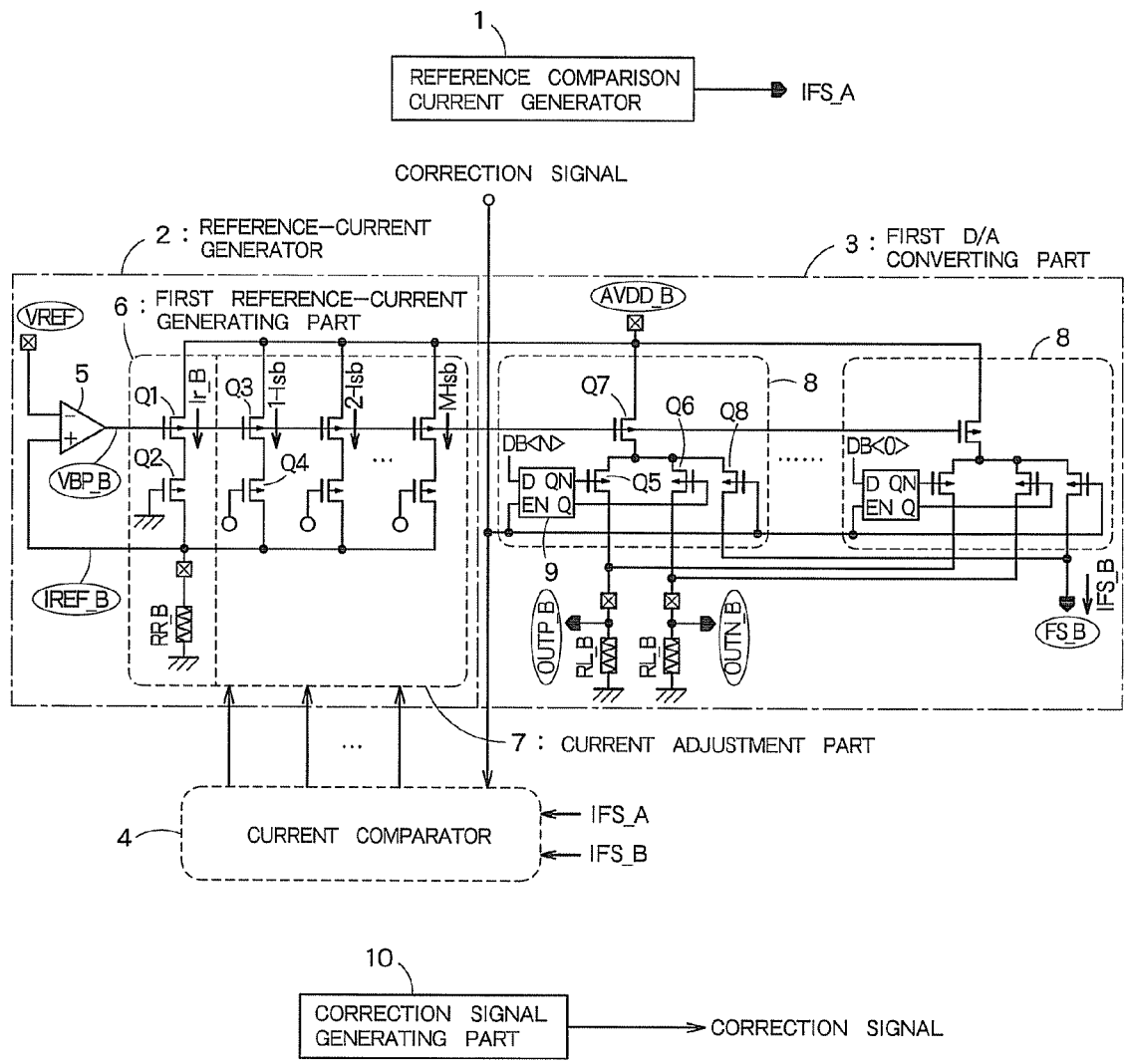
F I G. 1

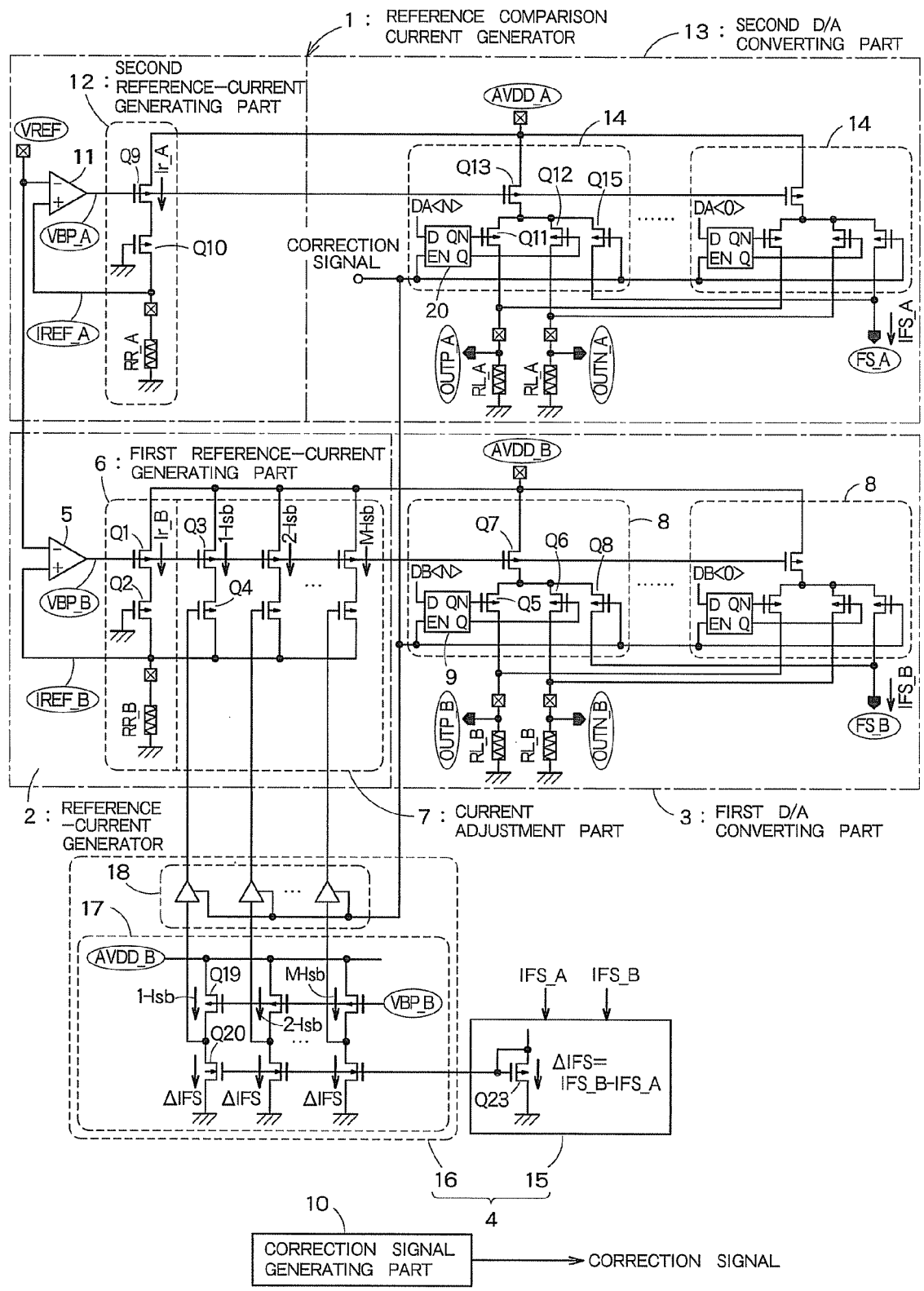
F I G. 2

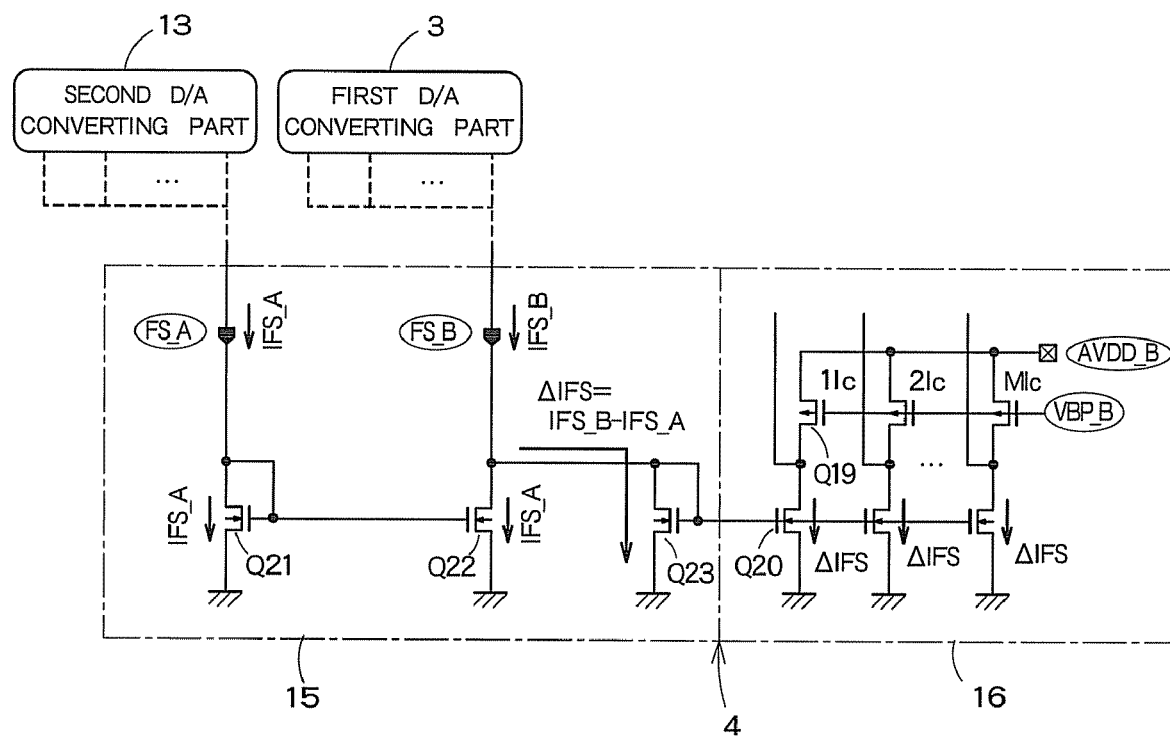
F I G. 3

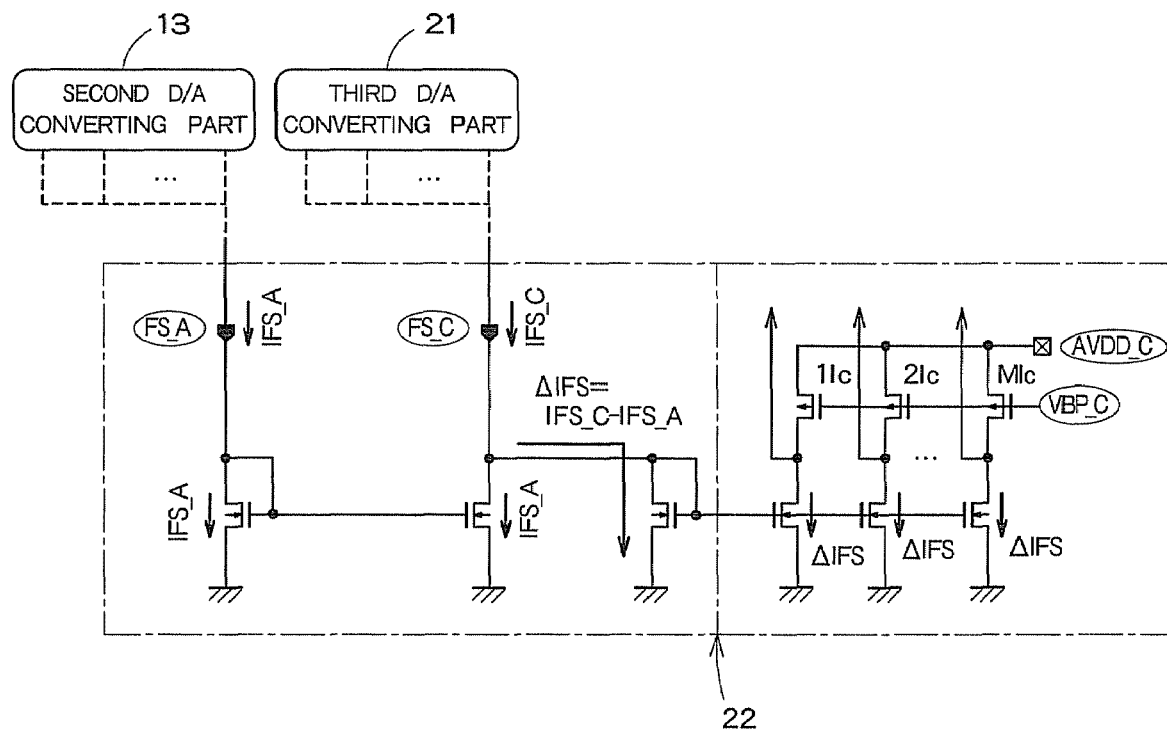
F I G. 5

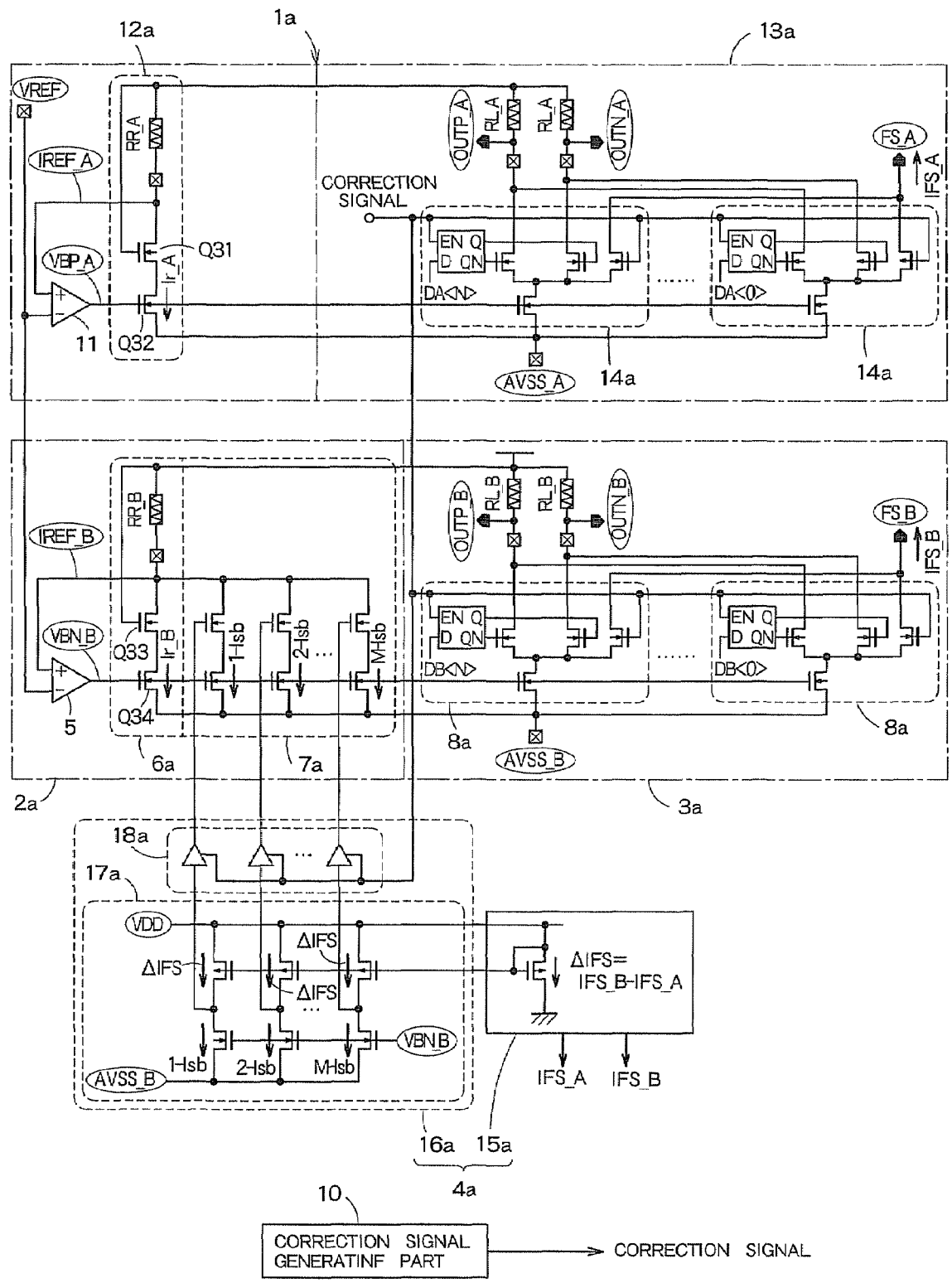
F I G. 6

D/A CONVERTER

CROSS REFERENCE TO RELATED APPLICATIONS

This application is based upon and claims the benefit of priority from the prior Japanese Patent Application No. 2006-331767, filed on Dec. 8, 2006, the entire contents of which are incorporated herein by reference.

BACKGROUND OF THE INVENTION

1. Field of the Invention

The present invention relates to a current-steering D/A converter.

2. Related Art

A current-steering D/A converter is known (refer to JP-A Kokai No. 2004-80238). By providing a plurality of D/A converters of this kind, it is possible to perform parallel D/A conversion of a plurality of channels in parallel.

However, when a plurality of D/A converters are provided, offset errors between each operational amplifier in the D/A converters occur, or accuracy of current mirror circuits used in the D/A converters fluctuates. Due to the offset errors and the fluctuation of the current mirror accuracy, output currents of the D/A converters fluctuate as well. These may cause gain errors between the D/A converters.

To solve this kind of problem, it is supposed to share an operational amplifier or a reference-current generating part in each D/A converter. However, even if a partial circuit in the D/A converter is shared, it is not easy to equalize the current mirror accuracy of the D/A converters, and therefore the gain errors may occur in each D/A converter.

Further, when a bias voltage and a power supply voltage of a current mirror circuit in each D/A converter are shared, fluctuations of these voltages may be reduced. However, a digital noise generated by one D/A converter may be overlapped to the shared bias voltage and the power supply voltage. In this case, noises appear not only in its own output but also in an output of the other D/A converter. Such noises are generally called a crosstalk noise.

An aforementioned conventional document describes a D/A converter which can correct a gain error described above. In the D/A converter, an output voltage is compared to a desired reference voltage and gain adjustment is made until the output voltage has approached the reference voltage, thereby attaining reduction in a gain error.

However, when the output voltage is compared with a reference voltage by voltage signal processing, a circuit for performing comparison processing is complicated, which causes a problem of increasing a circuit area and part cost.

SUMMARY OF THE INVENTION

According to one aspect of the present invention, a D/A converter comprising:

a reference comparison current generator configured to generate a reference comparison current;

a first reference current generator configured to generate a first reference current capable of correcting a current level;

a first D/A converting part capable of outputting a first full-scale current having a predetermined proportional relationship with the first reference current and capable of generating a first D/A converting voltage in accordance with first input digital data; and a current comparator configured to generate a difference current between the first full-scale current and the reference comparison current to determine a magnitude of the difference current, wherein the first reference current generator corrects the first reference current based on a result determined by the current comparator.

BRIEF DESCRIPTION OF THE DRAWINGS

FIG. 1 is a block diagram illustrating a schematic configuration of a D/A converter according to a first embodiment of the present invention;

FIG. 2 is a circuit diagram of a D/A converter according to a second embodiment of the present invention;

FIG. 3 is a circuit diagram illustrating an example of an internal configuration of a current comparator 4;

FIG. 5 is a circuit diagram illustrating an example of an internal configuration of a current comparator 22; and FIG. 6 is a circuit diagram of a D/A converter according to a third embodiment of the present invention.

DETAILED DESCRIPTION OF THE INVENTION

Figure 4A:
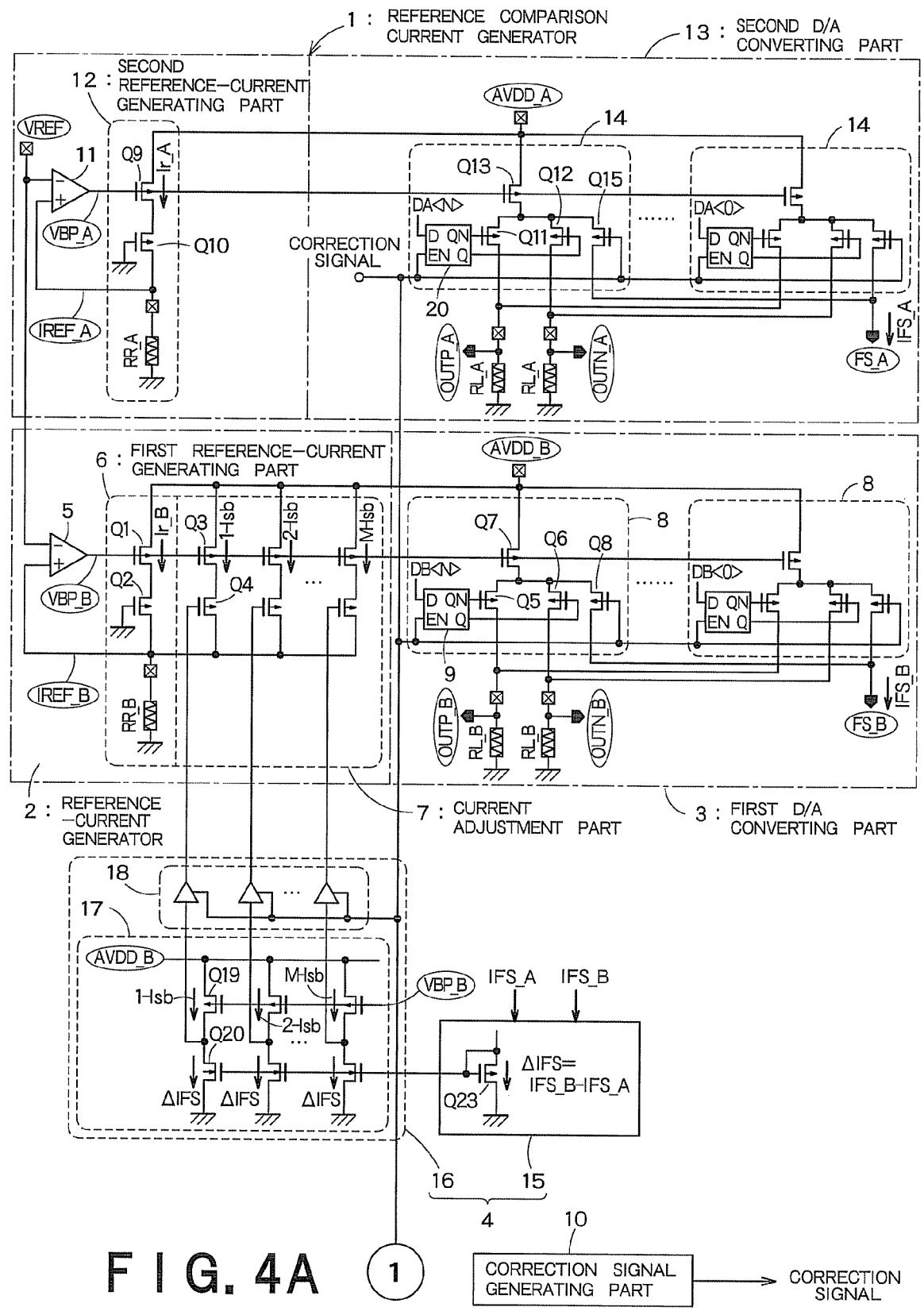
FIG. 4A is a circuit diagram illustrating an example of a 3-channel D/A converter.

With reference to the accompanying drawings, description will be given below of embodiments according to the present invention.

First Embodiment

FIG. 1 is a block diagram illustrating a schematic configuration of a D/A converter according to a first embodiment of the present invention. The D/A converter in FIG. 1 includes a reference comparison current generator 1, a reference-current generator 2 for current mirror circuit used in the D/A converter, a first D/A converting part 3, a current comparator 4 and a correction mode switching signal generating part (operation controller) 10.

The D/A converter in FIG. 1 has two modes: a mode for performing the usual D/A conversion (hereinafter referred to as a "normal operation mode") and a mode for adjusting current flowing through the first D/A converting part 3 (hereinafter referred to as a "correction mode"). Mode switching is performed by logic of a correction signal output from the correction mode switching signal generating part 10.

The reference comparison current generator 1 generates a reference comparison current IFS_A in a correction mode. The reference comparison current IFS_A is supplied to the current comparator 4.

The reference-current generator 2 generates a first reference current proportional to a current flowing through the first D/A converting part 3. In other words, it generates a reference current for current mirror circuit structured by two PMOS transistors Q1 and Q7. The first D/A converting part 3 generates a D/A conversion voltage (a first D/A conversion voltage) corresponding to a first input digital data in a normal operation mode, and generates a first full-scale current IFS_B having a predetermined proportional relationship with a first reference current in a correction mode.

In the correction mode, the current comparator 4 generates a differential current (IFS_B-IFS_A) between the reference comparison current IFS_A and the first full-scale current IFS_B, and generates a comparison determination signal obtained by determining the magnitude of the differential current (IFS_B-IFS_A). The comparison determination signal is input into the reference-current generator 2.

The reference-current generator 2 adjusts a first reference current based on the comparison determination signal determined by the current comparator 4 in the correction mode. More specifically, the reference-current generator 2 adjusts the first reference current so that the differential current becomes smaller.

The reference-current generator 2 has an operational amplifier 5, a first reference-current generating part 6 and a current adjustment part 7.

The first reference-current generating part 6 has a resistor RR_B and two PMOS transistors Q1, Q2 connected in series between a power supply terminal AVDD_B and a ground terminal. An output voltage of the operational amplifier 5 is supplied to a gate of a PMOS transistor Q1 and a gate of a PMOS transistor Q2 is grounded. The PMOS transistor Q2 acts as a normally-on switch.

The current adjustment part 7 has a configuration in which a plurality of transistor-groups having cascaded PMOS transistors Q3, Q4 connected between the AVDD_B and one end of the resistor RR_B are connected in parallel. A gate of the PMOS transistor Q3 is supplied with an output voltage of the operational amplifier 5 and further the gates and sources of the PMOS transistors Q1 and Q3 are connected in common respectively, so that a current mirror circuit is constituted of Q1 and Q3. In addition, a gate of a PMOS transistor Q4 is supplied with a comparison determination signal output from the current comparator 4, the gate serving as a switch of turning on and off a current of Q3 according to the comparison determination signal. The comparison determination signal is a signal corresponding to the magnitude of a differential current (IFS_B-IFS_A) between a reference comparison current IFS_A and a first full-scale current IFS_B.

The number of transistor-groups to be connected in parallel and the circuit configuration of each transistor-group are arbitrary. For example, as described below, the D/A converter according to a first embodiment of the present invention may be constituted of NMOS transistors.

As the magnitude of a differential current determined by the current comparator 4 gets larger, more current flowes through the current adjustment part 7. Because a constant current always flowes through the resistor RR_B by the virtual ground characteristics of the operational amplifier, a current Ir_B flowing through the transistors Q1 and Q2 in the first reference-current generating part 6 decreases as the current flowing through the current adjustment part 7 increases.

The first D/A converting part 3 has a plurality of differential current source cells 8 connected in parallel for the number of bits of input digital data and resistors RL_B connected in common to each of a positive and negative electrodes of the plurality of differential current source cells 8. Each differential current source cell 8 has two PMOS transistors Q5, Q6 for complementarily switching current paths, a PMOS transistor Q7 which is connected in common to sources of the PMOS transistors Q5, Q6, in which the transistor Q1 in the first reference-current generating part 6 and the gate and the source thereof are connected in common respectively and which constitutes the current mirror circuit with the transistor Q1, a bit input portion 9 for supplying data according to a corresponding bit of the input digital data to gates of the PMOS transistors Q5, Q6, and a PMOS transistor (a first current output portion) Q8 serving as a current path for current flowing through PMOS transistor Q7 in a correction mode. Further, each of the drains of PMOS transistors Q5, Q6 for complementarily switching the current path is connected with a resistor RL_B.

A PMOS transistor Q8 turns on only in a correction mode, and turns off in a normal operation mode. On the other hand, the pair of PMOS transistors Q5, Q6 complementarily turn on and off according to a bit value of the input digital data to switch the current path in a normal operation mode, while in a correction mode, both of the transistors Q5, Q6 turn off. To implement this on-off operation, the bit input portion 9 sets the gates of the pair of PMOS transistors Q5, Q6 at a high level so as to obtain an off state in the correction mode and further sets the gate of the PMOS transistor Q8 at a low level so as to obtain an on state. The bit input portion 9 sets, in a normal operation mode, the gates of the pair of PMOS transistors Q5, Q6 to a logic voltage according to a corresponding bit value of the input digital data and sets the gate of the PMOS transistor Q8 to a high level so as to obtain an off state.

The mode of the bit input portion 9 is switched by the logic of a correction signal. The correction signal is generated by the correction signal generating part 10.

A total of currents in the correction mode flowing through the PMOS transistor Q8 connected to each of the plurality of differential current source cells 8 is a first full-scale current and has a predetermined proportional relationship with a first reference current. The current flowing through each PMOS transistor Q8 is the same as the current flowing through the PMOS transistor Q7 as a current source of a corresponding differential current source cell 8.

All the PMOS transistor Q7 in the differential current source cell 8, the PMOS transistor Q1 in the first reference-current generating part 6 and the PMOS transistors Q3 in the plurality of transistor-groups constitute a current mirror circuit. Accordingly, as the magnitude of the differential current determined by the current comparator 4 gets higher, the current flowing through the transistor-group Q3 becomes larger, so that the first reference current flowing through the first reference-current generating part 6 decreases. Accordingly, the current flowing through the PMOS transistor Q7 in the differential current source cell 8 having a proportional relationship with the first reference current also decreases, which decreases a first full-scale current IFS_B as well as the differential current (IFS_B-IFS_A) detected by the current comparator 4.

In this way, the D/A converter in FIG. 1 performs feedback control in the correction mode so that a differential current (IFS_B-IFS_A) between a reference comparison current IFS_A and a first full-scale current IFS_B decreases. Thus, according to the present embodiment, it is possible to automatically correct gain fluctuations of the reference-current generator 2 and the first D/A converting part 3.

The present embodiment utilizes a current mirror circuit using a current during a correction processing period. Therefore, it is possible to simplify a circuit configuration. Further, since most of circuit components are MOS transistors, it is possible to easily integrate the entire D/A converter on the semiconductor substrate.

Moreover, correction processing in the present embodiment can be performed regardless of layout patterns and element variations in manufacturing, thus minimizing a core area. Furthermore, correction processing of the present embodiment can be performed after manufacture of the D/A converter, thus preventing subsequent characteristic variations in the D/A converter.

FIG. 1 describes an example of the reference-current generator 2 and the first D/A converting part 3 constituted of PMOS transistors, but they may be constituted of NMOS transistors. In addition, the first D/A converting part 3 has differential current source cells 8 for each bit of the input digital data, but it may have differential current cells 8 with the number of decoded input digital data. Furthermore, the internal configuration of the differential current source cells 8 is not limited to the configuration illustrated in FIG. 1.

Second Embodiment

A second embodiment embodies the first embodiment up to a circuit level.

FIG. 2 is a circuit diagram of a D/A converter according to the second embodiment of the present invention. FIG. 2 has the same reference characters on a configurational portion common to FIG. 1. Accordingly, differences from the first embodiment will be mainly described hereinafter.

A D/A converter in FIG. 2 has a reference comparison current generator 1, a reference-current generator 2 for current mirror circuit used in the D/A converter, a first D/A converting part 3, a current comparator 4 and a correction mode switching signal generating part 10 as is the case with FIG. 1.

The reference comparison current generator 1 has an operational amplifier 11 and a second reference-current generating part 12 and a second D/A converting part 13.

The second reference-current generating part 12 and the second D/A converting part 13 are connected between a power supply terminal AVDD_A and a ground terminal in parallel. Further, a gate of a PMOS transistor Q9 in the second reference-current generating part 12 and a gate of a PMOS transistor Q13 in the second D/A converting part 13 are connected in common to an output of the operational amplifier 11, thereby constituting a current mirror circuit by the transistors Q9 and Q13. A second reference-current generating part 12 has PMOS transistors Q9, Q10 connected in series between the power supply terminal AVDD_A and the ground terminal and a resistor RR_A.

The second reference-current generating part 12 generates a second reference current with virtual ground characteristics of the operational amplifier 11 and the resistor RR_A. A second D/A converting part 13 can output a second full-scale current having a predetermined proportional relationship with a second reference current and can generate a second D/A conversion voltage corresponding to a second input digital data.

A second D/A converting part 13 has a plurality of differential current source cells 14 provided for each bit of the second input digital data and the resistor RL_A connected in common to each of a positive and negative electrodes of the differential current source cells 14. The plurality of differential current source cells 14 are connected in parallel between the power supply terminal AVDD_A and one end of the resistor RL_A.

Each of the differential current source cells 14 has two PMOS transistors Q11, Q12 for complementarily switching a current path, a PMOS transistor Q13 which is connected in common to sources of the PMOS transistors Q11, Q12, of which gate and source are respectively connected in common to the transistor Q9 in the second reference-current generating part 12 and which constitutes a current mirror circuit with Q9, a bit input portion 20 for supplying data for a corresponding bit of input digital data to gates of the PMOS transistors Q11, Q12, and a PMOS transistor Q15 (a second current output portion) as a current path for a current flowing through the PMOS transistor Q13 in a correction mode. Further, a resistor RL_A is connected to each of the drains of the PMOS transistors Q11, Q12 for complementarily switching the current path.

The PMOS transistor Q15 turns on only in the correction mode and turns off in the normal operation mode. On the other hand, the pair of PMOS transistors Q11, Q12 complementarily turn on and off according to input digital data to switch a current path in the normal operation mode, while in the correction mode, both of Q11 and Q12 turn off. To implement this operation, the bit input portion 20 sets, in a correction mode, the gates of the pair of PMOS transistors Q11, Q12 at a high level to obtain an off state and sets the gate of the PMOS transistor Q15 at a low level to obtain an on state. Additionally, the bit input portion 20 sets, in the normal operation mode, the gates of the pair of PMOS transistors Q11, Q12 at a logic voltage corresponding to a value of a corresponding bit of the input digital data and sets the gate of the PMOS transistor Q15 at a high level to obtain an off state.

In each of the plurality of differential current source cells 14, a total of currents flowing through the PMOS transistor Q15 is a second full-scale current and has a predetermined proportional relationship with a second reference current. The current flowing through each PMOS transistor Q15 is the same as the current flowing through the PMOS transistor Q13 as a current source of a corresponding differential current source cell 14.

An input digital data supplied to the second D/A converting part 13 in the reference comparison current generator 1 is different from that supplied to the first D/A converting part 3. In other words, the D/A converter in FIG. 1 is a 2-channel D/A converter for converting two different types of input digital data into analog data in parallel. Two types of input digital data may be divided into a first and a second D/A converting parts 3, 13 in any way. In FIG. 2, by setting a full-scale current generated by the second D/A converting part 13 as a reference comparison current IFS_A, gain variation correction processing equivalent to the processing in the first embodiment is performed for a full-scale current IFS_B generated by the first D/A converting part 3.

The first D/A converting part 3 in FIG. 2 is configured in the same way as the first D/A converting part 3 in FIG. 1. The reference-current generator 2 in FIG. 2 has an example of a configuration embodying the reference-current generator 2 in FIG. 1. In FIG. 2, the reference-current generator 2 has a current adjustment part 7 connected in parallel with transistor-groups with the number of gradations requiring current correction. Each transistor-group in the current adjustment part 7 has two PMOS transistors Q3, Q4 longitudinally connected between the power supply terminal AVDD_B and one end of the resistor RR_B. A gate width W of the PMOS transistor Q3 of which gate is input with an output voltage of the operational amplifier 5 is different from each other for each transistor-group. In other words, the PMOS transistor Q1 of the first reference-current generating part 6 and the group of PMOS transistors Q3 in the current adjustment part 7 constituting a current mirror have different current mirror ratios from each other. For example, in the case where M transistor-groups are provided, the ratios of gate widths W are set to 1/N:2/N:3/N: ... NM/N, where N is an arbitrary current mirror ratio between Q1 and Q3, which is set to Q1:Q3=1:1/N. Accordingly, a current flowing through the transistor-group Q3 can be adjusted to a current of 1/N to M/N times, by each increment of 1/N, with respect to the current flowing through the transistor Q1. In other words, a current Ir_B flowing through the PMOS transistor Q1 of the first reference current-generating part 6 can be adjusted with current correction widths Ir_B/N to M·Ir_B/N and a correction increment Ir_B/N.

An example of a configuration of the number M of transistors and current mirror ratio N is described herein, however, the current correction width and correction increment may be arbitrarily set with a combination of M and N.

A ratio of a total of gate widths of the PMOS transistors Q13 owned by each of the plurality of differential current source cells 14 in the second D/A converting part 13 to a gate width of the PMOS transistor owned by the second reference-current generating part 12 in the reference comparison current generator 1, that is, a current mirror ratio is set so as to be equal to a ratio of a total of gate widths of the PMOS transistors Q7 owned by each of the plurality of differential current source cells 8 in the first D/A converting part 3 to a gate width of the PMOS transistor Q1 owned by the first reference-current generating part 6 in the reference-current generator 2, that is, a current mirror ratio.

The current comparator 4 in FIG. 2 has a current difference generating part 15 and a current comparing portion 16. The current difference generating part 15 generates a differential current (IFS_B-IFS_A) between the first full-scale current IFS_B and the full-scale current IFS_A of the second D/A converting part 13. The current comparing portion 16 has a group of current comparing circuits 17 constituted of the PMOS transistor Q19 and the NMOS transistor Q20 and an encoder latch portion 18 connected to an output of the group of current comparing circuits 17.

The group of current comparing circuits 17 in the current comparing portion 16 is connected in common with drains of the PMOS transistor Q19 and the NMOS transistor Q20. The current comparing circuit is configured so as to make an output according to the magnitude of each current flowing through Q19 and Q20 and more specifically, so that when an inequality of Q19 current<Q20 current is satisfied, a low level is output to the drain terminal, while when an inequality of Q19 current>Q20 current is satisfied, a high level is output to the drain terminal. The gate of the PMOS transistor Q19 is supplied with a gate voltage VBP_B of the current mirror circuit of the first reference-current generating part 6. The gate of the NMOS transistor Q20 is connected with the gate terminal (drain terminal) of the NMOS transistor Q23 of the current difference generating part 15.

More specifically, a combination of the NMOS transistor Q20 in the current comparing portion 16 and the NMOS transistor Q23 in the current difference generating part 15 constitutes a current mirror circuit of which the current mirror ratio is 1. The current corresponding to a differential current generated by the current difference generating part 15 is mirrored in the group of NMOS transistors Q20 in the current comparing portion 16. Moreover, the group of PMOS transistors 19 in the current comparing portion 16 constitutes a current mirror circuit with the PMOS transistor Q1 of the first reference-current generating part 6. The gate widths of the group of PMOS transistors Q19 in the current comparing portion 16 are different from each other and are set to the same ratio as the gate widths W of the group of the transistors Q3 in the current adjustment part 7.

The encoder latch portion 18 switches outputs of the group of current comparing circuits 17 between an output state and an output holding state according to a correction signal. An output of the encoder latch portion 18 is supplied to the gate of the corresponding PMOS transistor Q4 in the current adjustment part 7.

The first and the second D/A converting parts 3, 13 and the encoder latch portion 18 are supplied with a correction signal for switching the correction mode and the normal mode. In the correction mode, the correction signal becomes a first logic, and each of the first and second D/A converting parts 3, 13 generates a full-scale current. The encoder latch portion 18 supplies signals generated by the group of current comparing circuits 17 to the reference-current generator 2.

The current flowing through the current adjustment part 7 is determined by an output of the encoder latch portion 18 and the current flowing through the transistor Q1 of the first reference-current generating part 6 is adjusted by an amount corresponding to the magnitude of the current. The full-scale current IFS_B of the first D/A converting part 3 has a proportional relationship with the current flowing through Q1 of the first reference-current generating part 6. Accordingly, the full-scale current IFS_B of the first D/A converting part 3 is adjusted so that a differential current (IFS_B-IFS_A) to the full-scale current IFS_A of the second D/A converting part 13 decreases.

When the correction signal becomes a second logic, the normal operation mode is obtained and an output of the encoder latch portion 18 is fixed with an output in a correction mode maintained. Thus, the reference current corrected so that a differential current (IFS_B-IFS_A) is smaller is left flowing through the transistor Q1 inside the first reference-current generating part 6. The first D/A converting part 3 converts the input digital data to an analog voltage obtained by correcting gain fluctuation relative to the second D/A converting part 13. In addition, in the reference comparison current generator 1, the second D/A converting part 13 converts, in the normal operation mode, input digital data into an analog voltage based on a reference current generated by the second reference-current generating part 12.

FIG. 3 is a circuit diagram illustrating an example of an internal configuration of the current comparator 4. The current comparator 4 includes the current difference generating part 15 and the current comparing portion 16. The current difference generating part 15 includes an NMOS transistor Q21 which permits a full-scale current IFS_A output from the second D/A converting part 13 to flow through, a transistor Q22 which constitutes a current mirror circuit having a current mirror ratio 1 with the transistor Q21, and an NMOS transistor Q23 through which a differential current (IFS_B-IFS_A) between a full-scale current IFS_A running into the transistor Q22 by flowing a full-scale current IFS_B output from the first D/A converting part 3 toward the drain of the transistor Q22 and the full-scale current IFS_B output from the first D/A converting part 3 runs.

A combination of the NMOS transistor Q23 and the group of NMOS transistors Q20 in the current comparing portion 16 constitutes a current mirror circuit with a current mirror ratio 1, and the differential current (IFS_B-IFS_A) is current mirrored in the group of NMOS transistors Q20, respectively. A combination of the group of NMOS transistors Q20 and the group of PMOS transistors Q19 connected with the drains in common constitutes a current mirror circuit with the PMOS transistor Q1 of the first reference-current generating part 6. Moreover, the group of PMOS transistors Q19 has different gate widths from each other and is different in current mirror ratio from the PMOS transistor Q1 of the first reference-current generating part 6. For example, if the gate width W of each PMOS transistor Q19 is taken as 1/N:2/N: . . . :M/N, a current attempts to flow through each PMOS transistor Q19 at a rate of 1/N:2/N: . . . :M/N of a current Ir_B flowing through the PMOS transistor Q1 of the first reference-current generating part 6, where M is the number of PMOS transistors set by the current adjustment part 7 and N is the number set with a current mirror ratio 1:1/N of the PMOS transistor Q1 of the first reference-current generating part 6 to the PMOS transistor Q3 of the current adjustment part 7. Specifically, the group of PMOS transistors Q19 in the current comparing portion 16 and the group of PMOS transistors Q3 of the current adjustment part 7 are set to the same transistor size, respectively.

The NMOS transistor Q20 and the PMOS transistor Q19 in the current comparing portion 16 are connected with drains thereof with each other. Each one of transistors, because the other transistor of the pair constitutes a different current mirror circuit, is comparatively operated between the current attempting to flow through the NMOS transistor Q20 and that attempting to flow through the PMOS transistor Q19. More specifically, when an inequality of Q19 current<Q20 current is satisfied, a low level is output to the drain terminal connected with each other. On the other hand, when an inequality of Q19 current>Q20 current is satisfied, a high level is output to the drain terminal. In other words, comparison operation is performed in the differential current (IFS_B-IFS_A) current-mirrored on Q20 and each current (Ir_B/N, 2×Ir_B/N, ... M×Ir_B/N) current-mirrored on Q19, and a digital value obtained by determining the magnitude of the differential current is output from each drain terminal.

As described above, in the present embodiment, a full-scale currents IFS_B, IFS_A are output from the first and second D/A converting parts 3, 13 in a correction mode and the current difference generating part 15 generates a differential current (IFS_B-IFS_A) between both the currents. Then, the current comparing portion 16 determines the magnitude of the differential current (IFS_B-IFS_A) and controls the current flowing through the transistor-group of the current adjustment part 7 in the reference-current generator 2 according to a digital value of the determination results. This allows changing not only the current flowing through the first reference-current generating part 6 in the reference-current generator 2, but also the current flowing through the plurality of differential current source cells 8 in the first D/A converting part 3 having a predetermined relational relationship to the current. Thus, gain variations in the first and second D/A converting parts 3, 13 can be automatically corrected.

Furthermore, power supplies of the first and the second D/A converting parts 3, 13 and bias of a current source are independent, which enables reducing crosstalk noise between the first and the second D/A converting parts 3, 13.

In FIG. 2, the transistor Q3 corresponds to a first transistor, the transistor Q1 corresponds to a second transistor, the transistor Q19 corresponds to a third transistor, the transistor Q7 corresponds to a fourth transistor, the transistor Q9 corresponds to a fifth transistor, the transistor Q13 corresponds to a sixth transistor.

Third Embodiment

The second embodiment describes an example of a two-channel D/A converter, however, a D/A converter with three or more channels can be constituted. For example, in constituting a D/A converter of n channels (n being an integer greater than or equal to 2), a D/A converter for one arbitrary channel thereof is assigned to the reference comparison current generator in FIG. 2 and, for the other channels, it is sufficient to provide the reference comparison current generator in FIG. 2, the D/A converting part 3 and the current comparator 4 in FIG. 1.

Figure 4B:
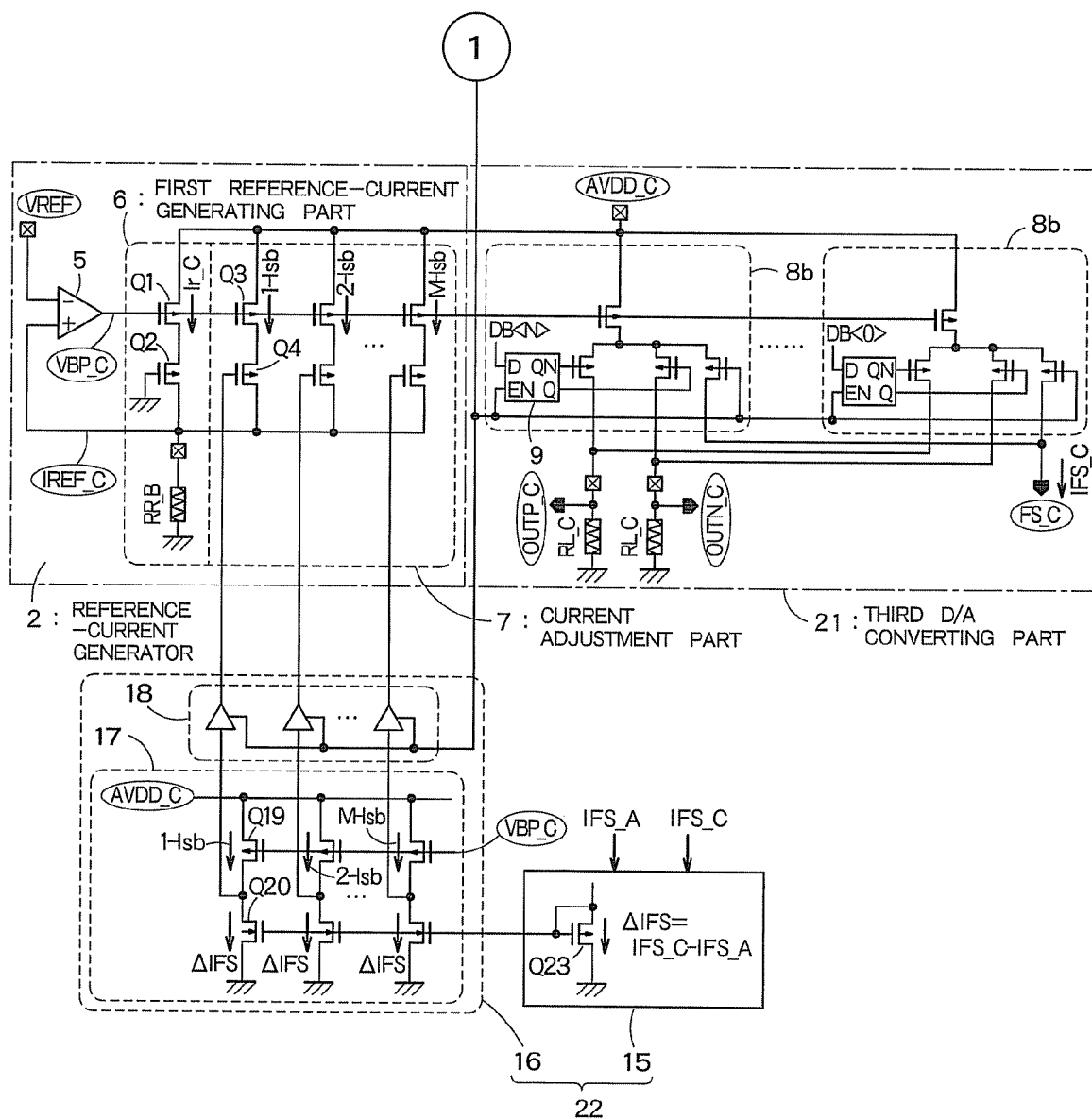
FIG. 4B is a circuit diagram illustrating an example of the 3-channel D/A converter.

For example, FIGS. 4A and 4B are circuit diagrams illustrating an example of a three-channel D/A converter, respectively. As illustrated in FIGS. 4A and 4B, a D/A converter of any one of three channels is assigned to the reference comparison current generator 1 and for each of the remaining two channels, the reference-current generator 2, the first D/A converting part 3 (or the third D/A converting part 21) and the current comparator 4 (or the current comparator 22) are provided.

As is the case with FIG. 3, the current comparator 4 generates, in a correction mode, a differential current (IFS_B-IFS_A) between a full-scale current output from the first D/A converting part 3 and a full-scale current IFS_A output from the reference comparison current generator 1, determines the magnitude thereof and outputs a digital value of the determination result. Moreover, as illustrated in FIG. 5, the current comparator 22 generates, in a correction mode, a differential current (IFS_C-IFS_A) between a full-scale current IFS_C output from the third D/A converting part 21 and a full-scale current IFS_A output from the reference comparison current generator 1, determines the magnitude thereof and outputs a digital value of the determination result.

In this way, even if the number of channels increases, the increase is assigned to the reference comparison current generator 1 with an arbitrary one channel as the reference to detect a differential current with other channels. This can share the reference comparison current generator 1, thus simplifying a circuit configuration.

Further, the D/A converter according to the present embodiment, capable of facilitating conversion into multiple channels, is suitable for electric apparatuses which make mandatory the use of multi-channel processing, such as liquid crystal displays and wireless apparatuses.

Fourth Embodiment

Unlike the second and third embodiments, a fourth embodiment uses a conductive transistor.

FIGS. 1 to 5 above describe examples in which main transistors in the D/A converter are constituted of PMOS transistors, but NMOS transistors may be used in place of the PMOS transistors. FIG. 6 is a circuit diagram of the D/A converter according to the third embodiment of the present invention.

The D/A converter in FIG. 6 includes a reference-current generator 2a, a reference comparison current generator 1a, a first D/A converting part 3a, a current difference generating part 15a and a current comparing portion 16a as with the first to third embodiments. The second reference-current generating part 12a in the reference comparison current generator 1a includes a resistor RR_A and NMOS transistors Q31, Q32 connected in series between a power supply terminal VDD and a ground terminal AVSS_A. In addition, the second D/A converting part 13a in the reference comparison current generator 1 includes a resistor RL_A of which one end is connected to the power supply terminal VDD and a plurality of differential current source cells 14a connected in parallel between the RL_A and the ground terminal AVSS_A.

The reference-current generator 2a has a first reference-current generating part 6a and a current adjustment part 7a. The first reference-current generating part 6a has a resistor RR_B and NMOS transistors Q33, Q34 connected in series between the power supply terminal VDD and a ground terminal AVSS_B. The current adjustment part 7a has a transistor-group connected in parallel between one end of the resistors RR_B and the ground terminal AVSS_B.

The first D/A converting part 3a has a resistor RL_B of which one end is connected to the power supply terminal VDD and a plurality of differential current source cells 8a connected in parallel between the resistors RL_B and the ground terminal AVSS_B.

The current comparing portion 16a in the current comparator 4a has a plurality of transistor-groups 17a connected in parallel between the power supply terminal VDD and the ground terminal AVSS_B.

Thus, even if NMOS transistors are used, a D/A converter having advantages equivalent to those of the second embodiment can be constituted.

Furthermore, a circuit equivalent to that of the third embodiment may be constituted of NMOS transistors.

What is claimed is:

1. A D/A converter comprising:
a reference comparison current generator configured to generate a reference comparison current;
a first reference current generator configured to generate a first reference current capable of correcting a current level;
a first D/A converting part capable of outputting a first full-scale current having a predetermined proportional relationship with the first reference current and capable of generating a first D/A converting voltage in accordance with first input digital data; and
a current comparator configured to generate a difference current between the first full-scale current and the reference comparison current to determine a magnitude of the difference current,
wherein the first reference current generator corrects the first reference current based on a result determined by the current comparator; and
the reference comparison current generator has:
a second reference current generator configured to generate a second reference current; and
a second D/A converting part capable of outputting a second full-scale current having a predetermined proportional relationship with the second reference current and capable of generating a second D/A converting voltage in accordance with second input digital data, the second full-scale current corresponding to the reference comparison current.

2. The D/A converter according to claim 1,
wherein the first reference current generator corrects the first reference current to decrease the difference current generated by the current comparator.

3. The D/A converter according to claim 1,
wherein the first D/A converting part generates the first D/A converting voltage without outputting the first full-scale current during a normal operation period; and
the second D/A converting part generates the second D/A converting voltage without outputting the second full-scale current during the normal operation period.

4. The D/A converter according to claim 1 further comprising:
an operation controller configured to control operations of the first D/A converting part, the second D/A converting part and the current comparator so that the first D/A converting part generates the first full-scale current and the second D/A converting part generates the second full-scale current during a correction period for correcting the first reference current.

5. A D/A converter comprising:
a reference comparison current generator configured to generate a reference comparison current;
a first reference current generator configured to generate a first reference current capable of correcting a current level;
a first D/A converting part capable of outputting a first full-scale current having a predetermined proportional relationship with the first reference current and capable of generating a first D/A converting voltage in accordance with first input digital data; and
a current comparator configured to generate a difference current between the first full-scale current and the reference comparison current to determine a magnitude of the difference current,
wherein the first reference current generator corrects the first reference current based on a result determined by the current comparator; and
the first D/A converting part has:
a plurality of first differential current source cells connected in parallel; and
a plurality of first current output parts which are provided corresponding to the plurality of first differential current source cells, and which output a current running through a current source of the corresponding first differential current source, and
the second D/A converting part has:
a plurality of second differential current source cells connected in parallel; and
a plurality of second current output parts which are provided corresponding to the plurality of second differential current source cells, and which output a current running through a current source of the corresponding second differential current source,
the first full-scale current being a sum of currents outputted from the plurality of first current output parts, and
the second full-scale current being a sum of currents outputted from the plurality of second current output parts.

6. The D/A converter according to claim 5,
wherein each of the plurality of first differential current source cells is provided corresponding to each bit of the first input digital data and generates a voltage in accordance with a value of the corresponding bit; and
each of the plurality of second differential current source cells is provided corresponding to each bit of the second input digital data and generates a voltage in accordance with a value of the corresponding bit.

7. The D/A converter according to claim 5,
wherein the plurality of first current output parts have a plurality of first switching elements configured to turn on only during a correction period for correcting the first reference current; and
the plurality of second current output parts have a plurality of second switching elements configured to turn on only during a correction period for correcting the first reference current.

8. The D/A converter according to claim 5 further comprising:
a first resistor commonly connected to the plurality of first differential current source cells; and
a second resistor commonly connected to the plurality of second differential current source cells.

9. A D/A converter comprising:
a reference comparison current generator configured to generate a reference comparison current;
a first reference current generator configured to generate a first reference current capable of correcting a current level;
a first D/A converting part capable of outputting a first full-scale current having a predetermined proportional relationship with the first reference current and capable of generating a first D/A converting voltage in accordance with first input digital data; and a current comparator configured to generate a difference current between the first full-scale current and the reference comparison current to determine a magnitude of the difference current, wherein the first reference current generator corrects the first reference current based on a result determined by the current comparator;

the first reference current generator has:

a current source through which a constant current flows; and a current adjustment part configured to bypass a partial current running through the current source in accordance with a magnitude of the difference current, and the first reference current is a difference current between the current running through the current source and the current running through the current adjustment part.

10. The D/A converter according to claim 9, wherein the first full-scale current decreases as the first reference current decreases.

11. The D/A converter according to claim 10, wherein the first D/A converting part has a plurality of first differential current source cells connected in parallel; and the current source, the current adjustment part and the plurality of first differential current source cells forms a current mirror circuit.

12. The D/A converter according to claim 11, wherein the current adjustment part has a plurality of first transistors connected in parallel, each of the first transistors having a gate width different from each other;

the current source has a second transistor; and the first transistor and the second transistor forming a current mirror circuit.

13. The D/A converter according to claim 12, wherein the current comparator has a plurality of third transistors connected in parallel, each of the third transistors having a gate width different from each other;

a ratio between the gate widths of the plurality of first transistors is equal to a ratio between the gate widths of the plurality of third transistors; and the plurality of first transistors, the second transistor and the plurality of third transistors forms a current mirror circuit.

14. The D/A converter according to claim 13, wherein a transistor size of each of the plurality of third transistors is equal to a transistor size of the corresponding first transistor.

15. The D/A converter according to claim 13, wherein the plurality of third transistors are provided corresponding to the plurality of first transistors; and currents running through the plurality of first transistors change in accordance with currents running through the plurality of third transistors.

16. The D/A converter according to claim 13, wherein each of the plurality of first differential current source cells has a fourth transistor forming a portion of a current mirror circuit; and the fourth transistor forms a current mirror circuit with the plurality of first transistors, the second transistor and the plurality of third transistors.

17. The D/A converter according to claim 16, wherein the reference comparison current generator has:

a second reference current generator configured to generate a second reference current; and a second D/A converting part capable of outputting a second full-scale current having a predetermined proportional relationship with the second reference current and capable of generating a second D/A converting voltage in accordance with second input digital data, wherein the second D/A converting part has a plurality of second differential current source cells connected in parallel, each of the plurality of second differential current source cells has a fifth transistor forming a current mirror circuit, and the second reference current generator has a sixth transistor forming a current mirror circuit with the fourth transistor.

18. The D/A converter according to claim 17, wherein a ratio of a sum of gate widths of the plurality of first transistors and a gate width of the second transistor to a sum of gate widths of the plurality of fourth transistors is equal to a ratio of a sum of gate widths of the fifth transistors to a sum of gate widths of the sixth transistors.

* * * * *